United States Patent
Avron et al.

(10) Patent No.: US 11,017,316 B2
(45) Date of Patent: May 25, 2021

(54) OPTIMAL EXPERIMENTAL DESIGN BASED ON MUTUAL INFORMATION AND SUBMODULARITY

(71) Applicants: INTERNATIONAL BUSINESS MACHINES CORPORATION, Armonk, NY (US); Ramot at Tel-Aviv University Ltd., Tel Aviv (IL)

(72) Inventors: Haim Avron, Tel-Aviv (IL); Guy M. Cohen, Ossining, NY (US); Lior Horesh, North Salem, NY (US); Raya Horesh, North Salem, NY (US); Gal Shulkind, Somerville, MA (US)

(73) Assignees: International Business Machines Corporation, Armonk, NY (US); RAMOT AT TEL-AVIV UNIVERSITY LTD., Tel Aviv (IL)

( * ) Notice: Subject to any disclaimer, the term of this patent is extended or adjusted under 35 U.S.C. 154(b) by 771 days.

(21) Appl. No.: 15/614,703

(22) Filed: Jun. 6, 2017

(65) Prior Publication Data

US 2018/0349798 A1 Dec. 6, 2018

(51) Int. Cl.
*G06N 7/00* (2006.01)
*G06N 20/00* (2019.01)
*G06F 30/00* (2020.01)

(52) U.S. Cl.
CPC ............ *G06N 20/00* (2019.01); *G06F 30/00* (2020.01); *G06N 7/005* (2013.01)

(58) Field of Classification Search
CPC .......... G06N 20/00; G06N 7/005; G06N 7/00; G06F 30/00
See application file for complete search history.

(56) References Cited

U.S. PATENT DOCUMENTS

| | | | |
|---|---|---|---|
| 6,718,055 | B1 | 4/2004 | Suri |
| 2004/0205397 | A1 | 10/2004 | Rajiv et al. |
| 2005/0246391 | A1 | 11/2005 | Gross |
| 2014/0100827 | A1 | 4/2014 | Guan et al. |

(Continued)

OTHER PUBLICATIONS

Khodja, Guided Bayesian optimal experimental design , 2010, IOP publishing (Year: 2010).*

(Continued)

*Primary Examiner* — Li Wu Chang
(74) *Attorney, Agent, or Firm* — Tutunjian & Bitetto, P.C.; Anthony Curro

(57) ABSTRACT

A computer-implemented method is presented for optimal experimental design to correct a misspecified model approximating a behavior of a dynamic system. The method includes formulating an experiment, determining experimental settings for configuring controllable experimental parameters based on mutual information and submodularity, measuring informative values associated with each choice of experimental design, as prescribed by the controllable experimental parameters, and learning a correction function based on the measured informative values. The computer-implemented method further includes determining an experimental design setup for gaining information content, and combining the experimental design setup with the experimental settings to construct a corrected model of the dynamic system.

20 Claims, 5 Drawing Sheets

(56) References Cited

U.S. PATENT DOCUMENTS

| | | | |
|---|---|---|---|
| 2015/0006129 A1* | 1/2015 | An | G06F 30/13 |
| | | | 703/2 |
| 2015/0254125 A1 | 9/2015 | Kakui | |
| 2016/0356677 A1* | 12/2016 | Bollas | G01M 99/005 |
| 2017/0061313 A1* | 3/2017 | Oros | G06F 11/3457 |

OTHER PUBLICATIONS

Krause, Near-optimal Nonmyopic Value of Information in Graphical Models, 2005, UAI'05: Proceedings of the Twenty-First Conference on Uncertainty in Artificial Intelligence July 2005 pp. 324-331 (Year: 2005).*

Box et al., "Bayesian Inference in Statistical Analysis," Wiley Classics Library Edition. Published 1992. pp. 1-61.

Calinescu et al., "Maximizing a Submodular Set Function Subject to a Matroid Constraint (Extended Abstract)," 12th International Integer Programming and Combinatorial Optimization Conference. Lecture Notes in Computer Science, vol. 4513. Jun. 25-27, 2007. pp. 1-15.

Chaloner et al., "Bayesian Experimental Design: A Review," Statistical Science, vol. 10, No. 3. Aug. 1995. pp. 273-304.

Chaturantabut et al., "Nonlinear Model Reduction Via Discrete Empirical Interpolation," Society for Industrial and Applied Mathematics, vol. 32, No. 5. Sep. 7, 2010. pp. 2737-2764.

V.V. Fedorov, "Theory of Optimal Experiments," Academic Press. 1972. pp. 1-202.

Kennedy et al., "Bayesian Calibration of Computer Models," Journal of Royal Statistical Society. Series B (Statistical Methodology). vol. 63, Issue 3. 2001. pp. 425-464.

Kortylewski et al., "Greedy Compositional Clustering for Unsupervised Learning of Hierarchial Compositional Models," arXiv.org, Computer Science, Computer Vision and Pattern Recognition. Jan. 22, 2017. pp. 1-16.

Krause et al., "Submodular Function Maximization," Tractability: Practical Approaches to Hard Problems. vol. 3, Issue 19. 2012. pp. 1-28.

Nemhauser et al., "An Analysis of Approximations for Maximizing Submodular Set Functions—I," Mathematical Programing. vol. 14. Dec. 1, 1978. pp. 265-294.

Rahimi et al., "Random Features for Large-Scale Kernel Machines," Neural Information Processing Systems (NIPS). vol. 3, No. 4. Dec. 3, 2007.pp. 1-8.

Rasmussen et al., "Gaussian Processes for Machine Learning," The Massachusetts Institute of Technology Press 2006. pp. 1-266.

Ryan et al., "A Review of Modern Computational Algorithms for Bayesian Optimal Design," International Statistical Review. vol. 84, No. 1. 2016. pp. 128-154.

* cited by examiner

OPTIMAL EXPERIMENTAL DESIGN BASED ON MUTUAL INFORMATION AND SUBMODULARITY

BACKGROUND

Technical Field

The present invention relates generally to methods for experimental designs, and more specifically, to optimal experimental design based on mutual information and submodulatiry.

Description of the Related Art

An experiment is a process or study that results in collection of data. The results of experiments are not known in advance. Usually, statistical experiments are conducted in situations in which researchers can manipulate conditions of the experiment and can control factors that are irrelevant to research objectives. Experimental design is the process of planning a study to meet specified objectives. Planning an experiment properly is important in order to ensure that the right type of data and a sufficient sample size and power are available to answer the research questions of interest as clearly and efficiently as possible.

Moreover, in experiments, learning regarding a behavior of a system or phenomena can be done through observations. The underlying question is what experiments can be conducted to inform a predictive model to correct for misspecifications.

SUMMARY

In accordance with an embodiment, a computer-implemented method is provided for optimal experimental design to correct a misspecified model approximating a behavior of a dynamic system. The method includes formulating an experiment, determining experimental settings for configuring controllable experimental parameters based on mutual information and submodularity, measuring informative values associated with each choice of experimental design as prescribed by the controllable experimental parameters, and learning a correction function based on the measured informative values. The computer-implemented method further includes determining an experimental design setup for gaining information content, and combining the experimental design setup with the experimental settings to construct a corrected model of the dynamic system.

In accordance with another embodiment, a computer system is provided for optimal experimental design to correct a misspecified model approximating a behavior of the dynamic system. The computer system includes a memory and a processor in communication with the memory, wherein the processor is configured to formulate an experiment, determine experimental settings for configuring controllable experimental parameters based on mutual information and submodularity, measure informative values associated with each choice of experimental design as prescribed by the controllable experimental parameters, learn a correction function based on the measured informative values, determine an experimental design setup for gaining information content, and combine the experimental design setup with the experimental settings to construct a corrected model of the dynamic system.

In accordance with another embodiment, a computer readable storage medium comprising a computer readable program is provided for optimal experimental design to correct a misspecified model approximating a behavior of the dynamic system. The computer readable program when executed on a computer causes the computer to perform the steps of formulating an experiment, determining experimental settings for configuring controllable experimental parameters based on mutual information and submodularity, measuring informative values associated with each choice of experimental design as prescribed by the controllable experimental parameters, learning a correction function based on the measured informative values, determining an experimental design setup for gaining information content, and combining the experimental design setup with the experimental settings to construct a corrected model of the dynamic system.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
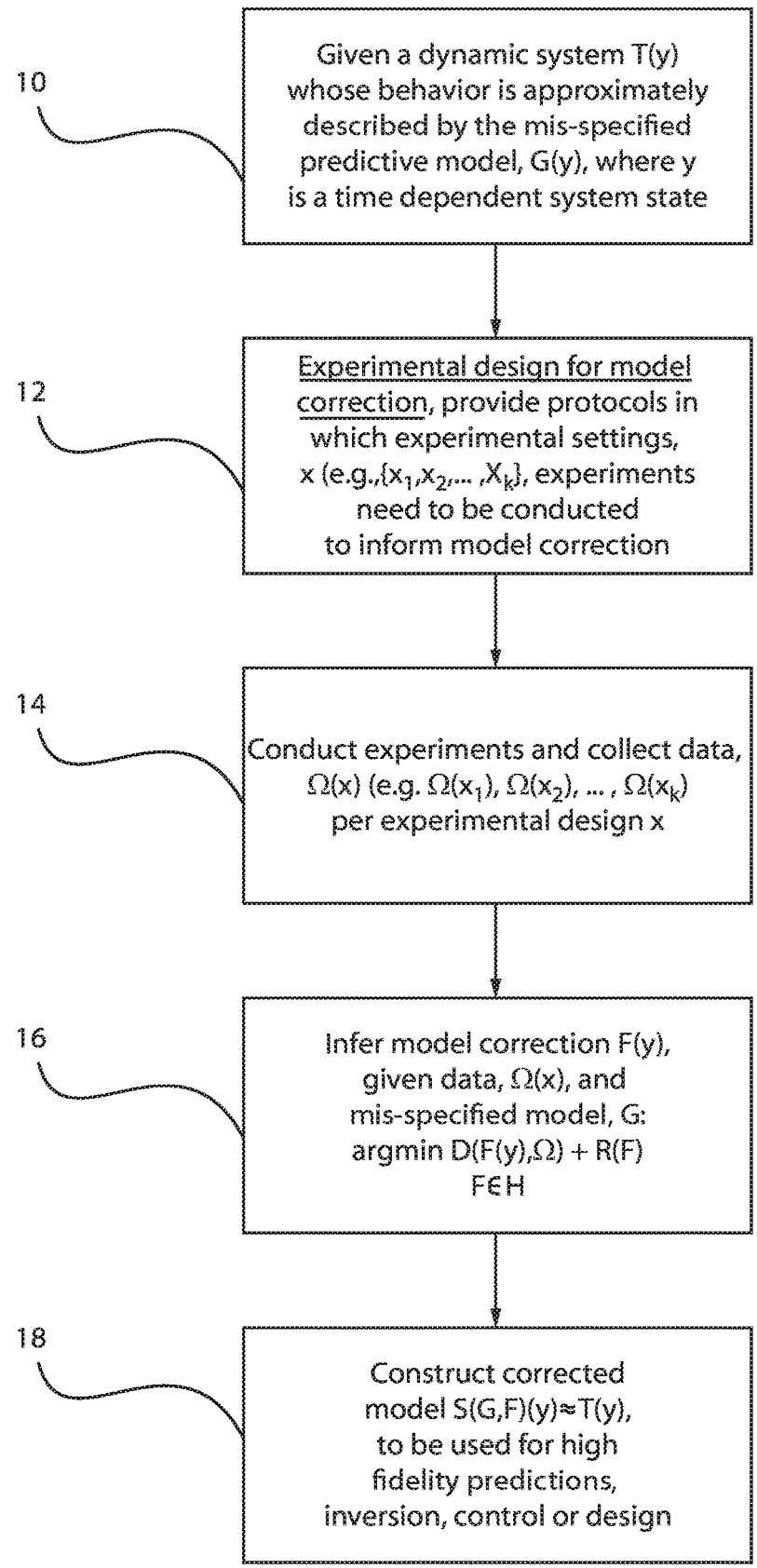
FIG. 1 is a block/flow diagram of a model misspecification correction process, in accordance with an embodiment of the present invention.

Embodiments in accordance with the present invention provide methods and devices for design of experiments (DOE). DOE is a systematic method to determine a relationship between factors affecting a system or process and an output of that system or process. This information is needed to manage process inputs in order to optimize the output. In the DOE, optimal designs are a class of experimental designs that are optimal with respect to some statistical criterion.

Embodiments in accordance with the present invention provide methods and devices for statistical modeling. In statistical modeling, regression analysis is a statistical process for estimating relationships among variables. It includes many techniques for modeling and analyzing several variables when the focus is on the relationship between a dependent variable and one or more independent variables (or predictors). More specifically, regression analysis helps a person understand how a value of the dependent variable (or criterion variable) changes when any one of the independent variables is varied, while the other independent variables are held fixed. Most commonly, regression analysis estimates the conditional expectation of the dependent variable given the independent variables, that is, the average value of the dependent variable when the independent variables are fixed. In all cases, an estimation target is a function of the independent variables, which is referred to as a regression function. In regression analysis, it is also of interest to characterize the variation of the dependent variable around the regression function which can be described by a probability distribution.

Embodiments in accordance with the present invention provide methods and devices for misspecification of a model. In the exemplary embodiments, a system and method is provided for optimal experimental design to correct a misspecified model approximating a behavior of a dynamic system. Embodiments in accordance with the present invention provide methods and devices for formulating an experiment, determining experimental settings for configuring controllable experimental parameters based on mutual information and submodularity, measuring informative values associated with each choice of experimental design as prescribed by the controllable experimental parameters, learning a correction function based on the measured informative values, determining an experimental design setup for gaining information content, and combining the experimental design setup with the experimental settings to construct a corrected model of the dynamic system.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a block/flow diagram of a model misspecification correction process, in accordance with an embodiment of the present invention.

The block diagram includes block 10 where a dynamic system T(y) is provided whose behavior is approximately described by a misspecified predictive model G(y), where y is a time dependent system state.

The process flows to block 12 where experimental design for model correction is performed. In block 12, protocols are provided for experimental settings, x (e.g. $\{x_1, x_2, \ldots, x_k\}$, where experiments are conducted to inform model correction.

In block 14, experiments are conducted and data is collected, the data represented as $\Omega(x)$ (e.g. $(x_1)$, $\Omega(x_2), \ldots, \Omega(x_k)$) per experimental design x.

The process then flows to block 16 where model correction F(y) is inferred given the data $\Omega(x)$ and misspecified model G is given as:

$$\underset{F \in \mathcal{H}}{\operatorname{argmin}} D(F(y), \Omega) + R(F).$$

In block 18, the corrected model is constructed as: S(G, F)(y)≈T(y), to be used for high fidelity predictions, inversion, control or design.

Model specification refers to the determination of which independent functions should be included in or excluded from a regression equation. In general, the specification of a regression model should be based primarily on theoretical considerations rather than empirical or methodological ones. A multiple regression model is, in fact, a theoretical statement about the causal relationship between one or more independent functions. Indeed, it can be observed that regression analysis involves three distinct stages: the specification of a model, the estimation of the parameters of this model, and the interpretation of these parameters.

Specification is the first and most critical of these stages. The estimates of the parameters of a model and an interpretation of them depend on the correct specification of the model. Consequently, issues can arise whenever a model is misspecified.

A specification error occurs when an independent variable is correlated with the error term. There are several different causes of specification error. For example, an incorrect functional form could be employed, a variable omitted from the model can have a relationship with both the dependent variable and one or more of the independent variables (omitted-variable bias), an irrelevant variable can be included in the model, the dependent variable can be part of a system of simultaneous equations (simultaneity bias), and measurement errors can affect the independent variables.

Models that are misspecified can have biased coefficients and error terms, and tend to have biased parameter estimations. Important variables can be missed for a variety of reasons, including by mistake or on purpose. The opposite of a left-out variable is an irrelevant variable. Irrelevant variables shouldn't have been put in the model in the first place.

In the design of experiments, optimal designs, are a class of experimental designs that are optimal with respect to some statistical criterion. A non-optimal design needs a greater number of experimental runs to estimate the functions with the same precision as an optimal design. In practical terms, optimal experiments can reduce the costs of experimentation.

The optimality of a design depends on the statistical model and is assessed with respect to a statistical criterion, which is related to the variance-matrix of the estimator. Specifying an appropriate model and specifying a suitable criterion function results from understanding statistical theory and practical knowledge with designing experiments.

The exemplary embodiments use a Bayesian approach, optimizing the design over a prior distribution of likely parameter values that are specified. The Bayesian D-optimality criterion is an expected logarithm of the determinant of an information matrix, taken with respect to a prior distribution. The choice design platform maximizes this expectation with respect to a prior probability distribution.

Optimal design is statistical inference about quantities of interest that can be improved by appropriately selecting the values of the control variables. These values should be chosen such that variability of the estimator of the parameters is minimized, or certain risk is minimized. Because of the costs and/or other limitations on resources or time, efficient use of available resource for experimental design is meaningful.

Bayesian optimal design uses a prior distribution on unknown parameters rather than single-value guesses. This would give more flexibility for a practitioner not just to bet on one guess, but a guess that incorporates uncertainty. With the incorporation of informative and/or historical knowledge of the unknown parameters, the Bayesian decision framework procedure has made it possible to utilize all the information available to the experimenter so that a better design can be achieved. A Bayesian design problem is a statistical decision issue, in which the design space, the utility function and the distribution of the random variables are all involved. When designing an experiment, decisions are usually made before data collection, and data collection is often restricted due to limited resources.

Figure 2:
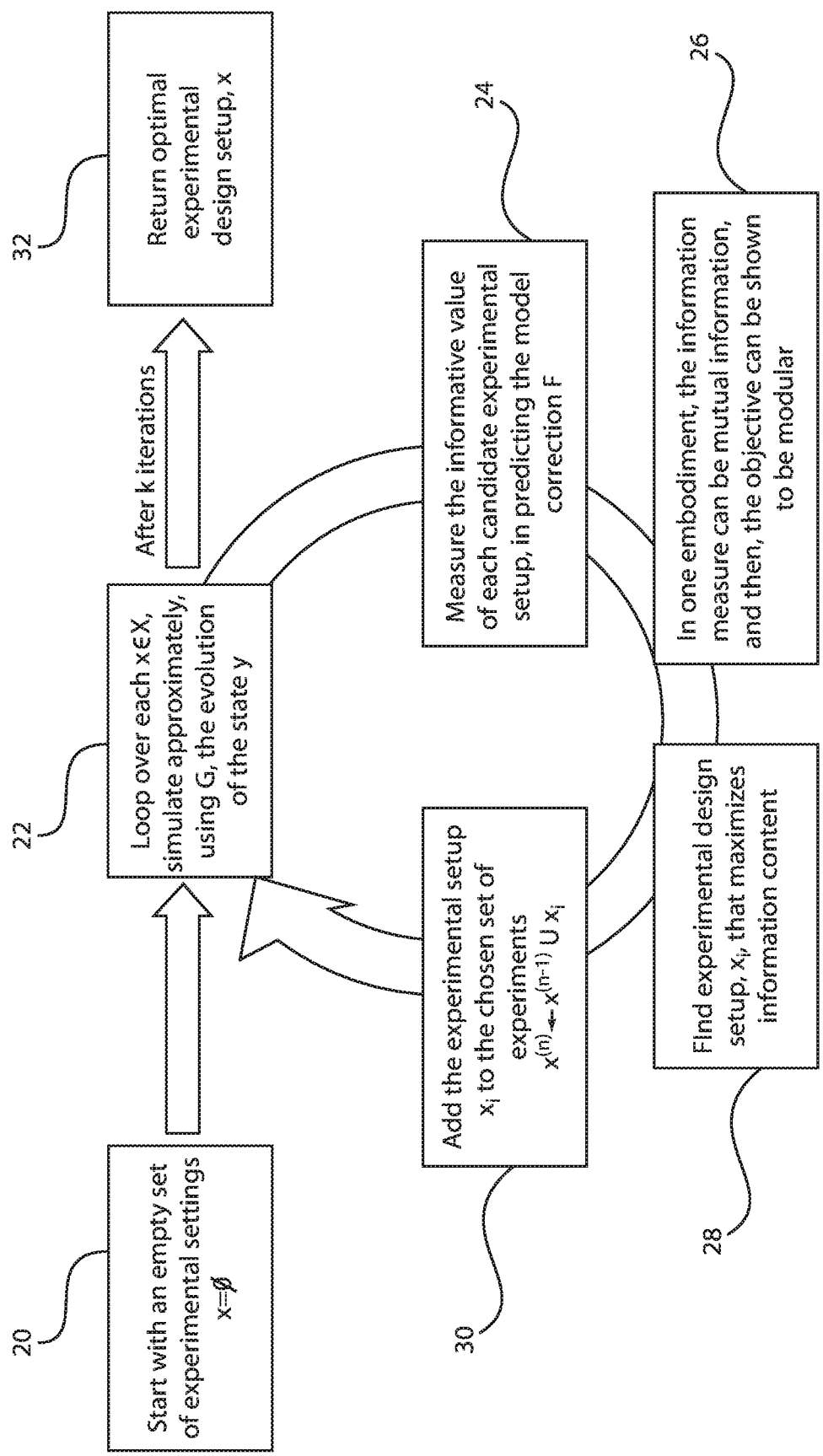
FIG. 2 is a block/flow diagram of an experimental design for model correction, in accordance with an embodiment of the present invention.

FIG. 2 is a block/flow diagram of an experimental design for model correction, in accordance with an embodiment of the present invention.

The block diagram includes block 20 where the process starts with an empty set of experimental settings x=Ø.

The process then proceeds to block 22 where the system loops over each x∈X, and simulates approximately, using G, an evolution of a state y.

In block 24, an informative value of each candidate experimental setup is measured in predicting a model correction F.

In block 26, in one exemplary embodiment, an information measure can be, e.g., mutual information, and then, the objective can be shown to be submodular.

In block 28, the experimental design setup, $x_i$, is found that maximizes information content.

In block 30, the experiential setup $x_i$ is added to a chosen set of experiments $x^{(n)} \leftarrow x^{(n-1)} \cup x_i$.

After k iterations, the process proceeds to block 32 where the optimal experimental design setup, x, is returned.

Mathematical models play an important role in understanding complex systems. Mathematical models often synthesize a large amount of information about a system into a single representation that can be used to give both conceptual insights into mechanisms and to make predictions about different experimental conditions. As the mechanistic understanding of the underlying processes grows, so too does the scope and complexity of mathematical models used to describe them. However, mathematical models are never a complete representation of a system. This is a strength, not a weakness, of mathematical modeling. Mathematical models always include simplifying approximations and abstractions that provide insights into which components of the system are ultimately responsible for a particular behavior. Mathematical models, therefore, ought to represent the judicious distillation of the essence of the behavior in question.

Unfortunately, it is difficult to identify a priori which components of a complex system can be ignored, e.g., which degrees of freedom are irrelevant. It is therefore common for mathematical models to be very complex and include more mechanisms than are strictly necessary to explain a phenomenon. When overly complex models are fit to data, the parameters associated with the irrelevant mechanisms are difficult to infer from observations. These parameters are said to be unidentifiable.

In an experiment, one or more process variables (or factors) are deliberately changed in order to observe the effect the changes have on one or more response variables. The statistical design of experiments (DOE) is an efficient procedure for planning experiments so that the data obtained can be analyzed to yield valid and objective conclusions. DOE begins with determining the objectives of an experiment and selecting the process factors for the study. An experimental design, such as an optimal design, is the laying out of a detailed experimental plan in advance of doing the experiment. Well-chosen experimental designs maximize the amount of "information" that can be obtained for a given amount of experimental effort. FIG. 2 introduces such an experimental design for model correction.

Regarding FIGS. 1 and 2, the Bayesian D-optimality design can be designated as H(•), or Shannon entropy, which naturally quantifies uncertainty.

For a prior uncertainty, it is defined as:

$H(\Theta) = \int \mathbb{P}(\Theta) \log \mathbb{P}(\Theta) d\Theta$

For posterior uncertainty, it is defined as:

$H(\Theta|\Omega) = \iint \mathbb{P}(\Omega, \Theta) \log \mathbb{P}(\Theta|\Omega) d\Omega d\Theta$ An optimal design minimizes $H(\Theta|\Omega)$, maximizes $I(\Theta;\Omega)$
Mutual information can be represented as:

$I(\Theta;\Omega) = H(\Theta) - H(\Theta|\Omega)$

The optimization problem form can be given as: $G(Y_0) \equiv I(\Theta;\Omega(Y))$ $$\hat{Y}_0 = \underset{Y_0: |Y_0| \leq K, Y_0 \subseteq y}{\operatorname{argmax}} G(Y_0)$$

A proxy is defined utilizing the misspecified trajectory $Y'(Y_0)$:

$G'(Y_0) \equiv I(\Theta;\Omega(Y'))$

The theorem is as follows:
Assume:
$\forall k, i: \|\phi(y^{(k)}(t_i)) - \phi(y'^{(k)}(t_i))\|_\infty \leq \delta$, small mis-specification
$\forall k, i: \|\phi(y^{(k)}(t_i))\|_\infty \leq B$, restricted output features
Then $$K' \log\left(1 - \frac{\alpha K'^{\frac{3}{2}}}{\sigma_{min}(\Sigma_\epsilon)}\right) \leq G(Y_0) - G'(Y_0) \leq K' \log\left(1 + \frac{\alpha K'^{\frac{3}{2}}}{\sigma_{min}(\Sigma_\epsilon)}\right)$$

with $\alpha \equiv \|\Sigma_\Theta^{vec}\|_1 \delta(\delta + 2B)$ and $\sigma_{min}(\cdot)$ the minimal singular value.

Regarding submodularity, the definition can be given as:
Let $\mathcal{V}$ be a set and $G: 2^\mathcal{V} \to \mathbb{P}$ a set function.

G is submodular if it satisfies the property of decreasing marginal:

$\forall S, T \subseteq \mathcal{V}$ such that $S \subseteq T$ and $x \in \mathcal{V} \setminus T$ It holds that:

$G(S \cup \{x\}) - G(S) \geq G(T \cup \{x\}) - G(T)$

G is monotonic (increasing) if:

$\forall S, T \subseteq \mathcal{V}$ s.t. $S \subseteq T$

Then: $G(S) \leq G(T)$
The theorem is:

Let $G': 2^\mathcal{Y} \to \mathbb{P}$ which is a set function defined according to:

$G'(Y_0) \equiv I(\Theta;\Omega(Y))$

Then G' is monotonic (increasing) and submodular.
The approximation algorithm can be given as:

---
Algorithm 1 Greedy Submodular Maximization
---
1: function GREEDYMAX(G(·), $\mathcal{V}$), K)
2:     S ← ∅
3:     for i = 1 to K do
4:         $x^* = \text{argmax}_{x \in \mathcal{V} \setminus S}$ G(S ∪ {x})
5:         S ← S ∪ {$x^*$}
6:     Return S
---

Figure 3:
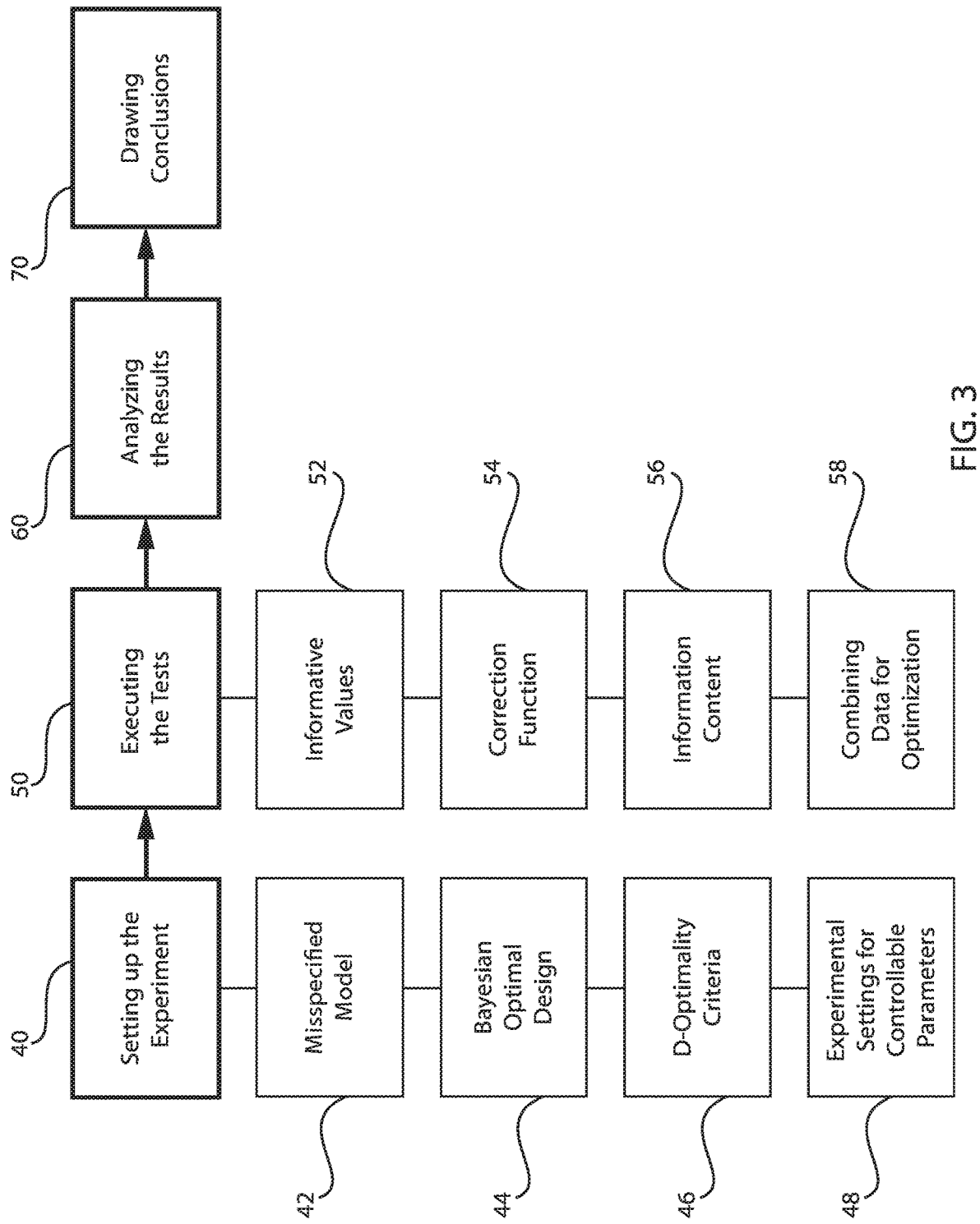
FIG. 3 is a block/flow diagram of an experimental process for optimal experimental design to correct a misspecified model approximating a behavior of a dynamic system, in accordance with an embodiment of the present invention.

FIG. 3 is a block/flow diagram of an experimental process for optimal experimental design to correct a misspecified model approximating a behavior of a dynamic system, in accordance with an embodiment of the present invention.

The general experimental process includes setting up an experiment 40, executing the tests 50, analyzing the results 60, and drawings conclusions 70.

The experiment setup 40 can include providing the misspecified model 42, implementing a Bayesian optimal design 44, using D-optimality criteria 46, and selecting experimental settings 48 for controllable parameters.

The test execution 50 can include determining informative values 52, implementing a correction function 54, determining information content 56, and combining data for optimization 58.

Figure 4:
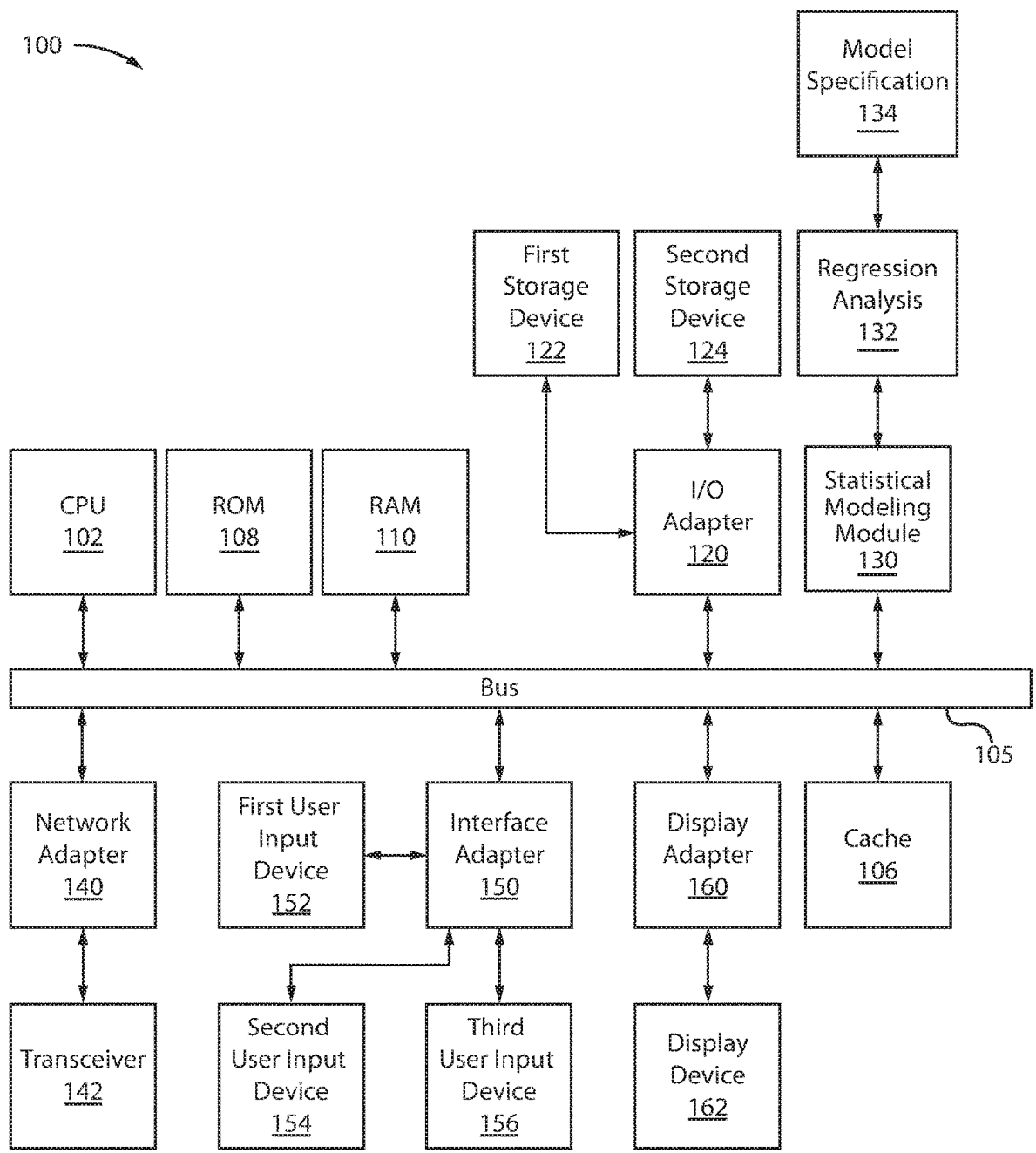
FIG. 4 is a block/flow diagram of a processing system including a statistical modeling module, in accordance with an embodiment of the present invention.

FIG. 4 is a block/flow diagram of a computer processing system including a statistical modeling module, in accordance with an embodiment of the present invention.

An exemplary processing system 100 to which the present invention can be applied is shown in accordance with one embodiment. The processing system 100 includes at least one processor (CPU) 102 operatively coupled to other components via a system bus 105. A cache 106, a Read Only Memory (ROM) 108, a Random Access Memory (RAM) 110, an input/output (I/O) adapter 120, a statistical modeling module 130, a network adapter 140, a user interface adapter 150, and a display adapter 160, are operatively coupled to the system bus 105.

A first storage device 122 and a second storage device 124 are operatively coupled to system bus 105 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A statistical modeling module 130 is operatively coupled to system bus 105. The statistical modeling module 130 can function or operate with a regression analysis module 132 and a model specification module 134.

A transceiver 142 is operatively coupled to system bus 105 by network adapter 140. A display device 162 is operatively coupled to system bus 105 by display adapter 160.

A first user input device 152, a second user input device 154, and a third user input device 156 are operatively coupled to system bus 105 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 152, 154, and 156 can be the same type of user input device or different types of user input devices. The user input devices 152, 154, and 156 are used to input and output information to and from system 100.

Of course, the processing system 100 can also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

Figure 5:
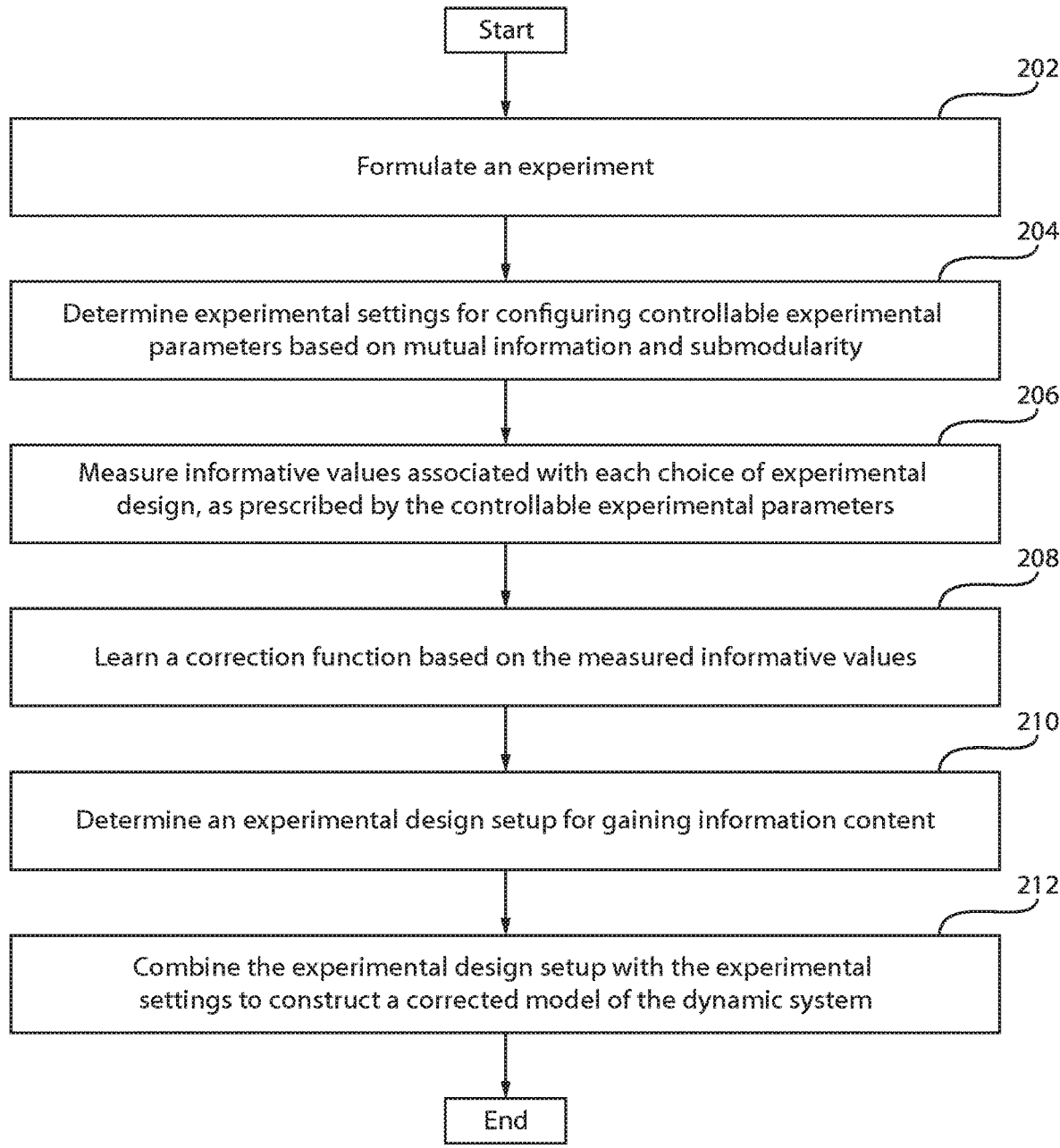
FIG. 5 is a block/flow diagram of an exemplary method for optimal experimental design to correct a misspecified model approximating a behavior of a dynamic system, in accordance with an embodiment of the present invention.

FIG. 5 is a block/flow diagram of an exemplary method for optimal experimental design to correct a misspecified model approximating a behavior of a dynamic system, in accordance with an embodiment of the present invention.

At block 202, an experiment is formulated.

At block 204, experimental settings are determined for configuring controllable experimental parameters based on mutual information and submodularity.

At block 206, informative values are measured from each of the controllable experimental parameters.

At block 208, a correction function is learned based on the measured informative values.

At block 210, an experimental design setup is determined for gaining information content.

At block 212, the experimental design setup is combined with the experimental settings to construct a corrected model of the dynamic system.

In summary, a system and method for optimal design of experiments to inform model correction is introduced. The system involves formulation of an experimental design problem as a D-Bayes optimal experimental design problem. The objective of the system is to find experimental settings, in which controllable experimental parameters, can be configured, such that an uncertainty associated with the model prediction following the measurement can be smaller (minimal) compared to an uncertainty before the collection of the data. This entails that an information gain in conducting an experiment is associated with a difference between an entropy of the system before the measurement and after the measurement. The more informative the experiment, the greater the gain in information. An exhaustive search of all potential experimental design is prohibitively intractable, as it entails selection of a subset out of a set, which introduces combinatorial complexity. However, through reformulation of the information gain as a monotonic submodular problem, the problem can be solved in polynomial run-time by a greedy algorithm.

The present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method for optimal experimental design to correct a misspecified model approximating a behavior of the dynamic system (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A computer-implemented method executed on a processor for optimal experimental design to correct a misspecified model approximating a behavior of a dynamic system, the method comprising:
    formulating a plurality of experiments each with a Bayesian D-optimality criterion;
    determining experimental settings for configuring controllable experimental parameters based on mutual information and submodularity, the controllable experimental parameters configured such that an uncertainty associated with model prediction following a measurement is minimized compared to an uncertainty before collection of data;
    measuring informative values associated with each choice of experimental design, as prescribed by the controllable experimental parameters;
    learning a correction function based on the measured informative values;
    determining an experimental design setup for gaining information content; and
    combining the information content derived from the experimental design setup with the experimental settings and the correction function to construct a corrected model of the dynamic system,
    wherein submodularity of each of the plurality of experiments includes greedy maximization of submodular.

2. The method of claim 1, wherein the Bayesian D-optimality criterion is an expected logarithm of a determinant of an information matrix taken with respect to a prior distribution.

3. The method of claim 1, wherein the submodularity involves an entropy function.

4. The method of claim 3, wherein the information content is associated with the entropy function before and after measurement of the informative values.

5. The method of claim 1, wherein the misspecified model approximating the behavior of the dynamic system is given as:

$$\underset{F \in \mathcal{H}}{\mathrm{argmin}} D(F(y), \Omega) + R(F)$$

where $F(y)$ is a model correction, $\Omega(x)$ is data, and y is a time-dependent system state.

6. The method of claim 1, wherein the corrected model is used for high fidelity predictions, inversion, control or design, the corrected model given as:

$$S(G,F) \approx T(y)$$

where $T(y)$ is a dynamic system, G is a misspecified predictive model, $F(y)$ is model correction, and y is a time-dependent system state.

7. The method of claim 1, wherein protocols are provided in which the experimental settings are conducted to assist in the learning of the correction function.

8. A computer system for optimal experimental design to correct a misspecified model approximating a behavior of the dynamic system, the computer system comprising:
    a memory; and
    a processor in communication with the memory, wherein the processor is configured to:
        formulate a plurality of experiments each with a Bayesian D-optimality criterion;
        determine experimental settings for configuring controllable experimental parameters based on mutual information and submodularity, the controllable experimental parameters configured such that an uncertainty associated with model prediction following a measurement is minimized compared to an uncertainty before collection of data;
        measure informative values associated with each choice of experimental design, as prescribed by the controllable experimental parameters;
        learn a correction function based on the measured informative values;
        determine an experimental design setup for gaining information content; and
        combine the information content derived from the experimental design setup with the experimental settings and the correction function to construct a corrected model of the dynamic system,
    wherein submodularity of each of the plurality of experiments includes greedy maximization of submodular.

9. The computer system of claim 8, wherein the Bayesian D-optimality criterion is an expected logarithm of a determinant of an information matrix taken with respect to a prior distribution.

10. The computer system of claim 8, wherein the submodularity involves an entropy function.

11. The computer system of claim 10, wherein the information content is associated with the entropy function before and after measurement of the informative values.

12. The computer system of claim 8, wherein the misspecified model approximating the behavior of the dynamic system is given as:

$$\underset{F \in \mathcal{H}}{\mathrm{argmin}} D(F(y), \Omega) + R(F)$$

where $F(y)$ is a model correction, $\Omega(x)$ is data, and y is a time-dependent system state.

13. The computer system of claim 8, wherein the corrected model is used for high fidelity predictions, inversion, control or design, the corrected model given as:

$$S(G,F) \approx T(y)$$

where T(y) is a dynamic system, G is a misspecified predictive model, F(y) is model correction, and y is a time-dependent system state.

14. The computer system of claim 8, wherein protocols are provided in which the experimental settings are conducted to assist in the learning of the correction function.

15. A non-transitory computer readable storage medium comprising a computer readable program for optimal experimental design to correct a misspecified model approximating a behavior of the dynamic system, wherein the computer readable program when executed on a computer causes the computer to perform the steps of:
formulating a plurality of experiments each with a Bayesian D-optimality criterion;
determining experimental settings for configuring controllable experimental parameters based on mutual information and submodularity, the controllable experimental parameters configured such that an uncertainty associated with model prediction following a measurement is minimized compared to an uncertainty before collection of data;
measuring informative values associated with each choice of experimental design, as prescribed by the controllable experimental parameters;
learning a correction function based on the measured informative values;
determining an experimental design setup for gaining information content; and
combining the information content derived from the experimental design setup with the experimental settings and the correction function to construct a corrected model of the dynamic system,
wherein submodularity of each of the plurality of experiments includes greedy maximization of submodular.

16. The non-transitory computer readable storage medium of claim 15, wherein the Bayesian D-optimality criterion is an expected logarithm of a determinant of an information matrix taken with respect to a prior distribution.

17. The non-transitory computer readable storage medium of claim 15, wherein the submodularity involves an entropy function.

18. The non-transitory computer readable storage medium of claim 17, wherein the information content is associated with the entropy function before and after measurement of the informative values.

19. The non-transitory computer readable storage medium of claim 15, wherein the misspecified model approximating the behavior of the dynamic system is given as:

$$\underset{F \in \mathcal{H}}{\mathrm{argmin}} D(F(y), \Omega) + R(F)$$

where F(y) is a model correction, $\Omega(x)$ is data, and y is a time-dependent system state.

20. The non-transitory computer readable storage medium of claim 15, wherein the corrected model is used for high fidelity predictions, inversion, control or design, the corrected model given as:

$$S(G,F) \approx T(y)$$

where T(y) is a dynamic system, G is a misspecified predictive model, F(y) is model correction, and y is a time-dependent system state.

* * * * *